United States Patent
Oh

(10) Patent No.: US 10,153,297 B2
(45) Date of Patent: Dec. 11, 2018

(54) ELECTRONIC DEVICE AND METHOD FOR FABRICATING THE SAME

(71) Applicant: SK hynix Inc., Gyeonggi-do (KR)

(72) Inventor: Kwang-Seok Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/827,279

(22) Filed: Nov. 30, 2017

(65) Prior Publication Data

US 2018/0083035 A1    Mar. 22, 2018

Related U.S. Application Data

(62) Division of application No. 15/207,235, filed on Jul. 11, 2016, now Pat. No. 9,881,935.

(30) Foreign Application Priority Data

Dec. 30, 2015   (KR) .................. 10-2015-0189738

(51) Int. Cl.
| | | |
|---|---|---|
| H01L 21/768 | (2006.01) | |
| H01L 27/11582 | (2017.01) | |
| H01L 27/11556 | (2017.01) | |
| H01L 27/11548 | (2017.01) | |
| H01L 27/11575 | (2017.01) | |

(52) U.S. Cl.
CPC .. *H01L 27/11582* (2013.01); *H01L 21/76816* (2013.01); *H01L 21/76829* (2013.01); *H01L 21/76877* (2013.01); *H01L 27/11548* (2013.01); *H01L 27/11556* (2013.01); *H01L 27/11575* (2013.01)

(58) Field of Classification Search
CPC ......... H01L 21/76816; H01L 21/76829; H01L 21/76877; H01L 21/11556; H01L 27/11582; H01L 23/5283; H01L 23/5226; H01L 27/11575; H01L 27/11556; H01L 27/11548
See application file for complete search history.

(56) References Cited

U.S. PATENT DOCUMENTS

2012/0135583 A1* 5/2012 Zang et al. ....... H01L 27/11582
                                                                438/433

* cited by examiner

*Primary Examiner* — Jasmine Clark
(74) *Attorney, Agent, or Firm* — IP & T Group LLP

(57) ABSTRACT

Provided is an electronic device including a semiconductor memory. The semiconductor memory may include: a substrate; and a stepped structure including first interlayer dielectric layers and conductive layers which are alternately stacked over the substrate, wherein ends of the conductive layers are exposed along the profile of the stepped structure, and the stepped structure further includes a barrier layer formed on a sidewall of the conductive layer.

14 Claims, 6 Drawing Sheets

ELECTRONIC DEVICE AND METHOD FOR FABRICATING THE SAME

CROSS-REFERENCE TO RELATED APPLICATIONS

This application is a division of U.S. patent application Ser. No. 15/207,235 filed on Jul. 11, 2016, now U.S. Pat. No. 9,881,935, which claims priority of Korean Patent Application No. 10-2015-0189738, filed on Dec. 30, 2015. The disclosure of each of the foregoing applications is incorporated herein by reference in its entirety.

BACKGROUND

1. Field

Exemplary embodiments of the present invention relate to a semiconductor device, and more particularly, to an electronic device including a plurality of memory cells which are vertically stacked over a substrate, and a method for fabricating the same.

2. Description of the Related Art

A NAND-type flash memory and the like have been developed as a semiconductor device which can store data and retain the stored data even though a power supply is cut off.

Recently, the improvement in integration density of a 2D memory device including memory cells which are formed as a single layer over a silicon substrate has reached the limit. Thus, a variety of 3D nonvolatile memory devices have been proposed, including a plurality of memory cells which are vertically stacked over a silicon substrate.

SUMMARY

Various embodiments are directed to an electronic device capable of securing a memory cell characteristic and an operation characteristic by preventing a bridge between memory cells, and a method for fabricating the same.

In an embodiment, there is provided an electronic device including a semiconductor memory. The semiconductor memory may include: a substrate; and a stepped structure including first interlayer dielectric layers and conductive layers, which are alternately stacked over the substrate, and a barrier layer formed on a sidewall of each of the conductive layers over each of the first interlayer dielectric layers, wherein ends of the conductive layers are exposed along a profile of the stepped structure. Each of the conductive layers may include protrusions formed over the exposed end of each of the conductive layers. The protrusion has sidewalls having a slope, and a top surface and the sidewalls of the protrusion are exposed along the profile of the stepped structure. The semiconductor memory may further include: a second interlayer dielectric layer formed over the stepped structure; and a plurality of contact plugs connected to the respective conductive layers through the second interlayer dielectric layer. The barrier layer may include an insulating material. The barrier layer may include an oxide material.

In an embodiment, a method for fabricating an electronic device including a semiconductor memory, the method may include: forming a stepped structure which first interlayer dielectric layers and first material layers are alternately stacked over a substrate, each of the first material layers including a barrier layer formed on a sidewall of each of the first material layers over each of the first interlayer dielectric layers, wherein ends of the first material layers and the barrier layers are exposed along a profile of the stepped structure; forming a second material layer over the ends of the first material layers and the barrier layers in the stepped structure; forming a second interlayer dielectric layer over the stepped structure; forming a groove by removing the first and second material layers; and burying a conductive layer in the groove. The first material layer may include a nitride material. The first and second material layers may include a nitride material, and the first and second interlayer dielectric layer may include an oxide material. The forming of the stepped structure may include: forming a structure including the first interlayer dielectric layers and the first material layers which are alternately stacked over the substrate, wherein the first interlayer dielectric layers include a lowermost layer and an uppermost layer of the structure; etching the structure such that the ends of the first interlayer dielectric layers are exposed along the profile of the stepped structure; forming the barrier layers, each formed on the sidewall of each of the first material layers; and etching the exposed ends of the first interlayer dielectric layers. The barrier layers may include an oxide material. The barrier layers may be formed through an oxidation process. The barrier layers may be formed through a radical oxidation process. The forming of the second material layer may include: forming the second material layer along the profile of the stepped structure forming the second material layer along the profile of the stepped structure; forming a third material layer over the second material layer such that the third material layer has a thickness on a vertical surface of the stepped structure smaller than a thickness on a horizontal surface of the stepped structure; removing the third material layer formed on the vertical surface of the stepped structure; and removing the second material layer formed on the vertical surface of the stepped structure. The third material layer may include an oxide material. The removing of the third material layer may be performed through a wet etching process. The removing of the second material layer may be performed through a wet etching process using phosphoric acid. The forming of the groove may be performed through a wet etching process using phosphoric acid. The method may further include forming a plurality of contact plugs connected to the respective conductive layers through the second interlayer dielectric layer, after the burying the conductive layer. The second material layer may be formed to have sidewalls having a slope and a top surface and the sidewalls of the second material layer are exposed along the profile of the stepped structure.

DETAILED DESCRIPTION

Figure 1:
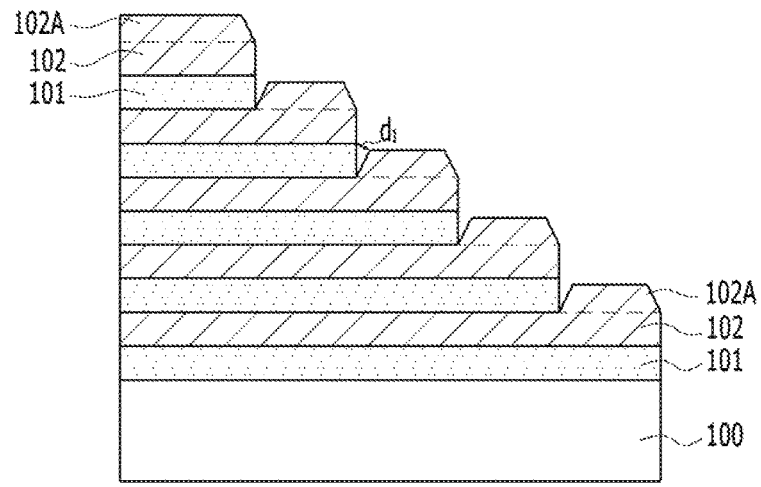
FIG. 1 is a cross-sectional view of a semiconductor device according to a comparative example.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Before various embodiments are described, problems which occur in a semiconductor device in accordance with a comparative example will be described as follows.

FIG. 1 is a cross-sectional view of a semiconductor device according to a comparative example.

Referring to FIG. 1, the semiconductor device according to the comparative example may include a stepped structure formed over a substrate 100 in which a predetermined lower structure (not illustrated) is formed. The stepped structure may include a plurality of interlayer dielectric layers 101 and a plurality of memory cells 102, which are alternately stacked. Each of the memory cells 102 may include a protrusion 102A exposed along the stepped structure. The protrusion 120A may serve as a necessary element for preventing a contact open defect and a punch caused by over-etching during a subsequent process for forming a contact plug.

However, due to the protrusion 102A included in each of the memory cells 102, a distance $d_1$ between lower and upper memory cells 102 may be shortened. The protrusion 102A may make it difficult to secure a minimum distance required for operations of the memory cells 102, and a bridge may be formed between upper and lower memory cells 102.

The present embodiment provides a semiconductor device which is capable of addressing the above-described concern of the comparative example, that is, a semiconductor device which is capable of securing a distance between memory cells, thereby preventing a bridge between the memory cells and securing a memory cell characteristic and an operation characteristic, and a method for fabricating the same.

Figure 2:
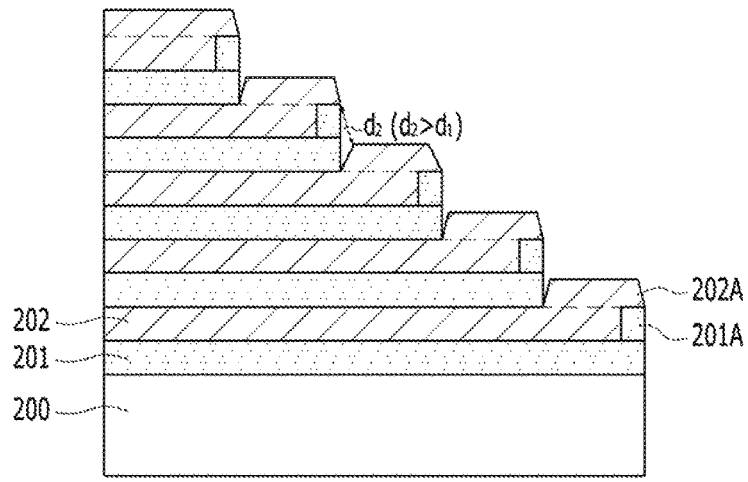
FIG. 2 is a cross-sectional view of a semiconductor device according to an embodiment of the present invention.

FIG. 2 is a cross-sectional view of a semiconductor device according to an embodiment of the present invention.

As illustrated in FIG. 2, the semiconductor device according to the embodiment of the present invention may include a stepped structure including interlayer dielectric layers 201 and conductive layers 202, which are alternately stacked over a substrate 200 in which a predetermined lower structure (not illustrated) is formed. The stepped structure may include a structure in which the interlayer dielectric layers 201 and the conductive layers 202 are alternately and repetitively stacked over the substrate 200. The stepped structure may have a structure in which ends of the conductive layers 202 are exposed along the profile of the stepped structure. Further, each of the conductive layers 202 may include a protrusion 202A formed on the exposed end of each of the conductive layers 202. The protrusion 202A may be formed to have sidewalls having a slope, and a top surface and the sidewalls of the protrusion 202A may be exposed along the profile of the stepped structure.

In particular, the semiconductor device according to the present embodiment may further include a barrier layer 201A formed on a sidewall of each of the conductive layers 202. The barrier layer 201A may be formed on the sidewall of each of the conductive layers 202 over each of the interlayer dielectric layers 201. The barrier layer 201A may include an insulating material, and have a structure covering the sidewall of each of the conductive layers 202. As a result, a distance $d_2$ between lower and upper conductive layers 202 is larger than the distance $d_1$ in FIG. 1.

The interlayer dielectric layers 201 may serve to insulate the conductive layers 202 adjacent in the vertical direction, and include an insulating material such as silicon oxide. The conductive layers 202 may include various conductive materials such as metal, metal nitride, polysilicon doped with impurity or a combination thereof, which can serve as a memory cell. The barrier layer 201A may include an insulating material for preventing a bridge between the conductive layers 202 by securing the distance $d_2$ between the upper and lower conductive layers 202.

As such the semiconductor device according to the present embodiment may include the barrier layer 201A which is formed on the sidewall of each of the conductive layers 202 and includes an insulating material, thereby securing the distance $d_2$ between upper and lower conductive layers 202, that is, between memory cells. Thus, the semiconductor device can prevent a bridge between the memory cells and secure a memory cell characteristic and an operation characteristic.

FIGS. 3A to 3I are cross-sectional views illustrating a method for fabricating a semiconductor device according to an embodiment of the present invention.

Figure 3A:
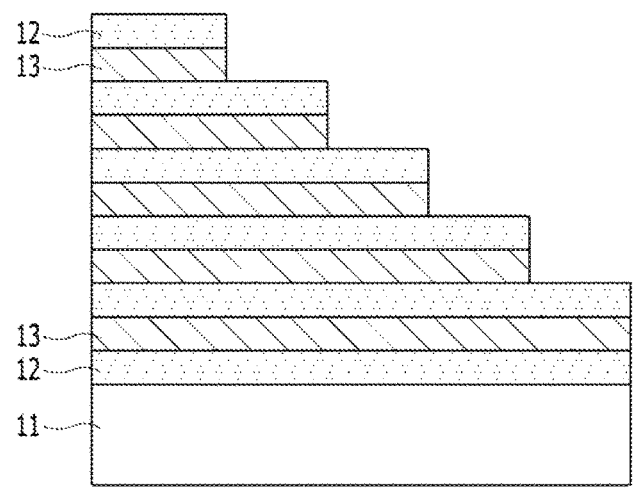
FIGS. 3A to 3I are cross-sectional views illustrating a method for fabricating a semiconductor device according to an embodiment of the present invention.

As illustrated in FIG. 3A, a substrate 11 may be prepared. The substrate 11 may include a semiconductor material. Although not illustrated, the substrate 11 may include a predetermined lower structure (not illustrated), for example, a source line, a lower select transistor and the like.

Then, a stepped structure may be formed over the substrate 11, the stepped structure including first interlayer dielectric layers 12 and first material layers 13, which are alternately stacked. The stepped structure may include a structure in which the first interlayer dielectric layers 12 and the material layers 13 are alternately and repetitively stacked. Furthermore, the stepped structure may have a structure in which the first interlayer dielectric layers 12 are partially exposed along the profile of the stepped structure. The first interlayer dielectric layers 12 may include lowermost and uppermost layers of the stepped structure.

The first interlayer dielectric layer 12 may serve to insulate conductive layers adjacent in the vertical direction, and include an insulating material such as silicon oxide. The first material layer 13 may include a material layer which is to be replaced with a conductive layer serving as a memory cell, during a subsequent process. The first material layer 13 may be formed of a material having an etching selectivity to the first interlayer dielectric layer 12 or a different etch rate from the first interlayer dielectric layer 12. This is to prevent a loss of the first interlayer dielectric layer 12 during a subsequent process for removing the first material layer 13. For example, when the first interlayer dielectric layer 12 is formed of silicon oxide, the first material layer 13 may include silicon nitride.

The process of forming the stepped structure may include a series of processes of forming a structure in which the first interlayer dielectric layers 12 and the first material layers 13 are alternately stacked over the substrate 11, forming a mask pattern over the uppermost layer of the structure, that is, the uppermost first interlayer dielectric layer 12, and alternately and repetitively performing a process of reducing the horizontal area of the mask pattern and a process of etching the structure. At this time, the mask pattern may include a material having an etching selectivity to the substrate 11, the first interlayer dielectric layer 12, and the first material layer 13. The process of reducing the horizontal area of the mask pattern is to expand an area exposed through the mask pattern. The width and thickness of the mask pattern may be reduced as the process of etching the structure is repeated, and the mask pattern may remain over the structure until the first interlayer dielectric layers 12 are patterned from the uppermost first interlayer dielectric layer 12 to the lowermost first interlayer dielectric layer 12. After the process of etching the structure is completed, the mask pattern may be removed.

The process of etching the structure may be performed in a different manner according to the number of the first interlayer dielectric layers 12 and the first material layers 13, which are stacked in the structure. Furthermore, as the process of etching the structure is repeated, the end portions of the first interlayer dielectric layers 12 may be sequentially exposed from the bottom. The areas of the first interlayer dielectric layers 12 and the first material layers 13 may decrease toward the top from the substrate 11.

As the stepped structure is formed, the electrical coupling between memory cells to be formed through a subsequent process and surrounding circuits for example, a power supply coupled through a contact, may be easily performed.

Figure 3B:
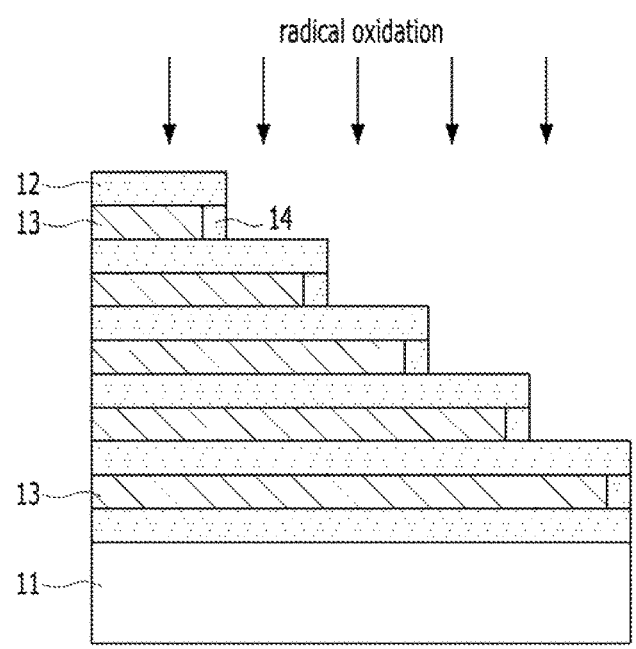

As illustrated in FIG. 3B, an oxidation process may be performed. Thus, the first interlayer dielectric layer 12 including an oxide material is may be maintained as is and a part of the first material layer 13 including a nitride material may be converted into a second material layer 14. At this time, the part of the first material layer 13 may correspond to a sidewall of the first material layer 13 exposed along the profile of the stepped structure. The second material layer 14 may serve as a barrier layer for securing a distance between memory cells which are formed during a subsequent process.

The oxidation process may include a radical oxidation process. The radical oxidation process may refer to a process using a radical as an oxidizer. Unlike an existing thermal oxidation process for oxidizing only silicon, the radical oxidation process can oxidize silicon nitride using the strong oxidizing power of the radical. The radical oxidation process may be performed through a thermal oxidation process or a plasma oxidation process. When the first material layer 13 includes a nitride material, a radical oxidation process using an oxygen radical may be used as the radical oxidation process. The oxygen radical ($O_2^-$) may be generated from $N_2O$, $O_3$, $NO_2$ or a combination gas thereof, or generated through IN-Situ Steam Generation (ISSG).

Figure 3C:
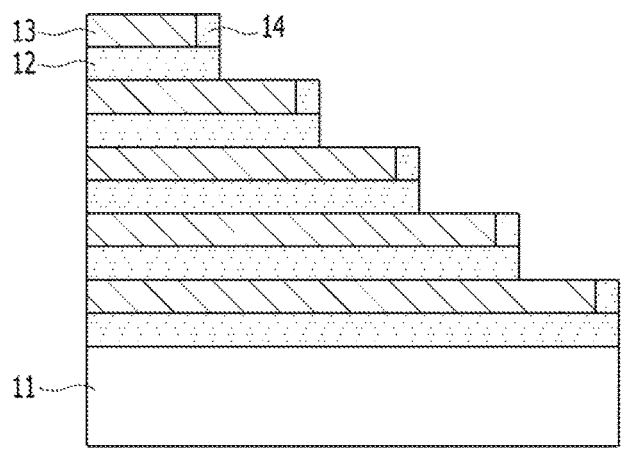

As illustrated in FIG. 3C, the first interlayer dielectric layers 12 exposed along the profile of the stepped structure may be removed. The first interlayer dielectric layers 12 may be removed through dry etching. The etching process for the first interlayer dielectric layers 12 may be performed until the first material layers 13 are exposed. Since the second material layer 14 formed on the sidewall of the first material layer 13 is positioned on the same surface as the first material layer 13, the second material layer 14 may not be significantly damaged but can be maintained when the first interlayer dielectric layer 12 is etched.

As the exposed first interlayer dielectric layer 12 is removed, the end portions of the first material layers 13 and the second material layers 14 may be exposed along the profile of the stepped structure in the opposite manner to the structure illustrated in FIG. 3B.

Figure 3D:
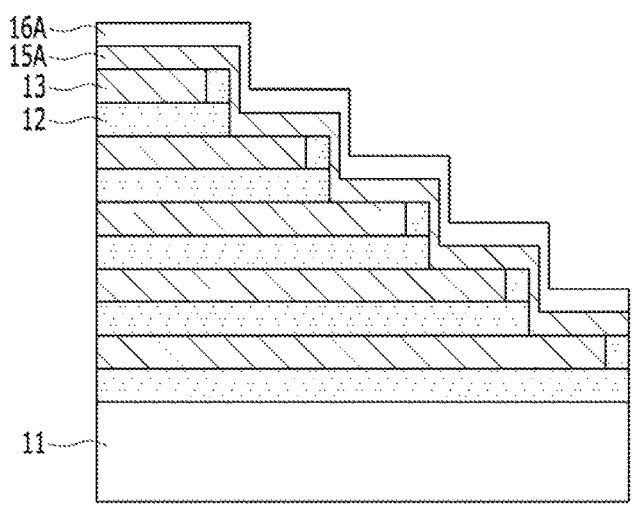

As illustrated in FIG. 3D, a third material layer 15A and a fourth material layer 16A may be sequentially formed along the profile of the stepped structure. The third material layer 15A may serve as a victim layer for forming a pad which prevents an open defect and a punch during a subsequent etching process for contact formation. The third material layer 15A may be formed of the same material as the first material layer 13. For example, the third material layer 15A may include silicon nitride. The third material layer 15A may be formed to a uniform thickness on the entire surface along the profile of the stepped structure. In another embodiment, the third material layer 15A may be formed under the condition that step coverage is poor. In this case, the third material layer 15A may have a relatively large thickness on the horizontal surface of the stepped structure, and have a relatively small thickness on the vertical surface of the stepped structure.

The fourth material layer 16A may serve as an etch barrier for etching the third material layer 15A. The fourth material layer 16A may include a material having an etching selectivity to the third material layer 15A, or specifically a material having a different etch rate from the third material layer 15A during wet etching. For example, when the third material layer 15A includes a nitride material, the fourth material layer 16A may include an oxide material. The fourth material layer 16A may be formed of an oxide material with poor step coverage such that the fourth material layer 16A may have a relatively large thickness on the horizontal surface of the stepped structure, and have a relatively small thickness on the vertical surface of the stepped structure. For example, the fourth material layer 16A may include an oxide material formed using High Density Plasma (HDP).

Figure 3E:
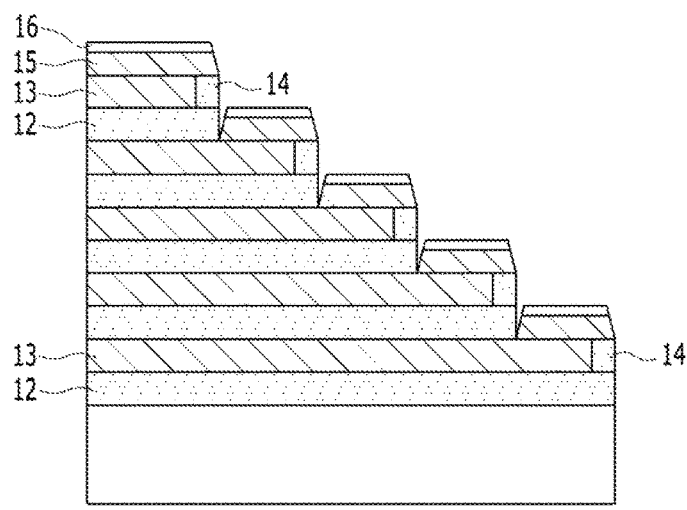

As illustrated in FIG. 3E, the third and fourth material layers 15A and 16A may be etched. Thus, the third and fourth material layers 15 and 16 may remain only over the exposed portions of the first and second material layers 13 and 14 in the stepped structure. That is, the third and fourth material layers 15 and 16 formed on the vertical surface of the stepped structure may be all removed, and only the third and fourth material layers 15 and 16 formed on the horizontal surface of the stepped structure may remain. At this time, the third and fourth to material layers 15 and 16 remaining on the horizontal surface of the stepped structure may be formed to have sidewalls having a slope.

The process of etching the third and fourth material layers 15A and 16A may be divided into a process of etching the fourth material layer 16A and a process of etching the third material layer 15A. Each process of etching the third and fourth material layers 15A and 16A may be performed through a wet etching process for removing oxide or nitride.

First, a primary etching process for removing the fourth material layer 16A formed on the vertical surface of the stepped structure may be performed. The primary etching process may include a wet etching process using an etching solution capable of selectively removing oxide. The primary etching process may be performed until the fourth material layer 16A formed on the vertical surface of the stepped structure is removed to expose the third material layer 15 thereunder. At this time, the fourth material layer 16A, which is formed to a larger thickness on the horizontal surface than on the vertical surface the stepped structure, may remain at a predetermined thickness over the third material layer 15.

Subsequently, a secondary etching process may be performed to remove the third material layer 15A exposed by the primary etching process, that is, the third material layer 15A formed on the vertical surface of the stepped structure. The secondary etching process may include a wet etching process using an etching solution capable of selectively removing nitride. The secondary etching process may be performed until the third material layer 15A formed on the vertical surface of the stepped structure is removed to expose the second material layer 14 thereunder.

Through the two wet etching processes, the third material layer 15 may remain in an island shape on the horizontal surface of the stepped structure.

Figure 3F:
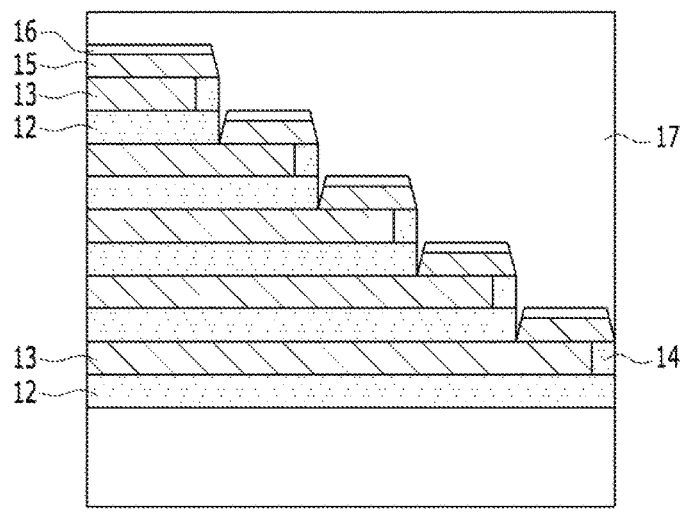

As illustrated in FIG. 3F, a second interlayer dielectric layer 17 may be formed over the stepped structure. The second interlayer dielectric layer 17 may be formed of a material having an etching selectivity to the first and third material layers 13 and 15. For example, when the first and third material layers 13 and 15 include nitride, the second interlayer dielectric layer 17 may include oxide.

The second interlayer dielectric layer 17 may be formed through Physical Vapor Deposition (PVD), Chemical Vapor Deposition (CVD), Sub-Atmospheric Chemical Vapor Deposition (SACVD), Low Pressure Chemical Vapor Deposition (LPCVD), Plasma Enhanced Chemical Vapor Deposition (PECVD) or High Density Plasma Chemical Vapor Deposition (HDP CVD).

The second interlayer dielectric layer 17 may be formed of HDP oxide, TetraEthylOrthoSilicate (TEOS), Plasma Enhanced TetraEthylOrthoSilicate (PE-TEOS), Ozone-Tetra Ethyl Ortho Silicate ($O_3$-TEOS), Undoped Silicate Glass (USG), Phosphosilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) or a combination thereof. Furthermore, the second interlayer dielectric layer 17 may include silicon nitride, silicon oxynitride or a low-k material having a low dielectric constant.

The second interlayer dielectric layer 17 may be formed to a thickness sufficient to cover the stepped structure. That is, a top surface of the second interlayer dielectric layer 17 is positioned at a higher level than a top surface of the stepped structure. Due to the profile of the stepped structure, the second interlayer dielectric layer 17 may also have a stepped structure or a curved structure. When subsequent processes such as contact and interconnection processes are performed on the second interlayer dielectric layer 17 having a curved structure, a contact open defect or an uneven line thickness may occur. Thus, after the second interlayer dielectric layer 17 is formed, a planarization process for removing a curved structure may be performed. The planarization process may include a chemical mechanical polishing (CMP) process.

Figure 3G:
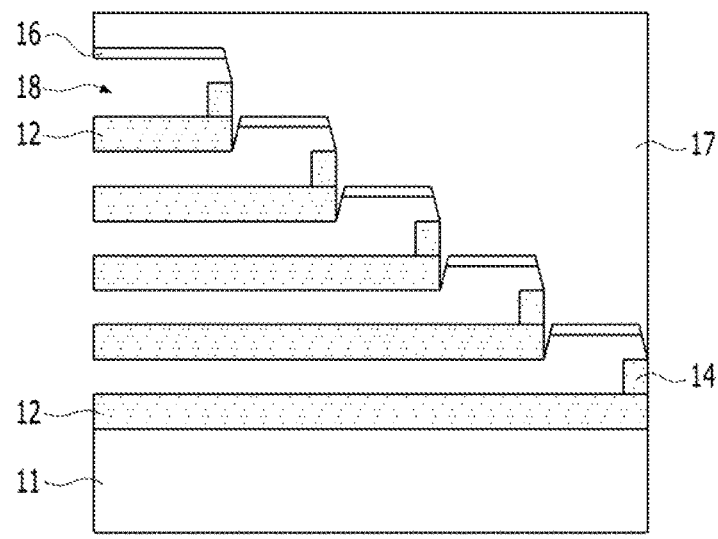
Figure 3H:
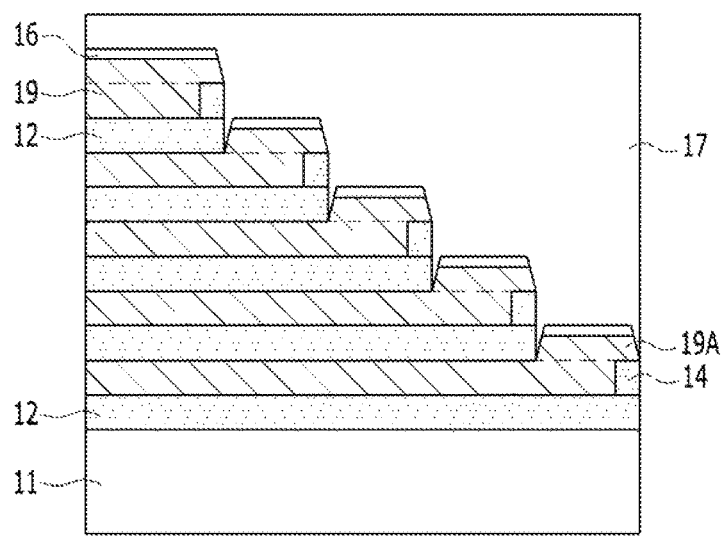

As illustrated in FIG. 3G, the first material layers 13 and the third material layers 15 may be removed. The first and third material layers 13 and 15 may be removed through wet etching. The wet etching process may be performed under the condition that the first and third material layers 13 and 15 have an etching selectivity to the first and second interlayer dielectric layers 12 and 17 during wet etching. For example, when the first and second interlayer dielectric layers 12 and 17 include an oxide material and the first and third material layers 13 and 15 include a nitride material such as silicon nitride, the wet etching process may be performed using a phosphoric acid ($H_3PO_4$) solution.

To remove the first and third material layers 13 and 15, a slit (not illustrated) may be formed at the other side of the stepped structure. That is, the first interlayer dielectric layers 12, the first material layers 13, the third material layers 15 and the fourth material layers 16 at the other side of the stepped structure may be sequentially etched to form a trench which exposes the substrate 11. The first material layer 13 of which the sidewall is exposed through the slit and the third material layer 15 which overlaps the first material layer 13 may be selectively removed through wet etching.

At the position from which the first and third material layers 13 and 15 are removed, a groove 18 may be formed. The groove 18 may serve as a conductive layer region for a memory cell during a subsequent process.

As illustrated in FIG. 3F, a conductive layer 19 may be buried in the groove 18. The conductive layer 19 may include various conductive materials such as metal, metal nitride, polysilicon doped with impurity or a combination thereof, which can serve as a memory cell.

Through the above-described series of processes, the stepped structure may be formed, the stepped structure including the first interlayer dielectric layers 12 and the conductive layers 19 which are alternately stacked. In particular, the conductive layer 19 may have a protrusion 19A at the exposed end thereof in the stepped structure. Furthermore, the second material layer 14 including an insulating material may be formed on a sidewall of the conductive layer 19 over the first interlayer dielectric layer 12, and secure a distance between the upper and lower conductive layers 19, thereby preventing a bridge between memory cells.

Figure 3I:
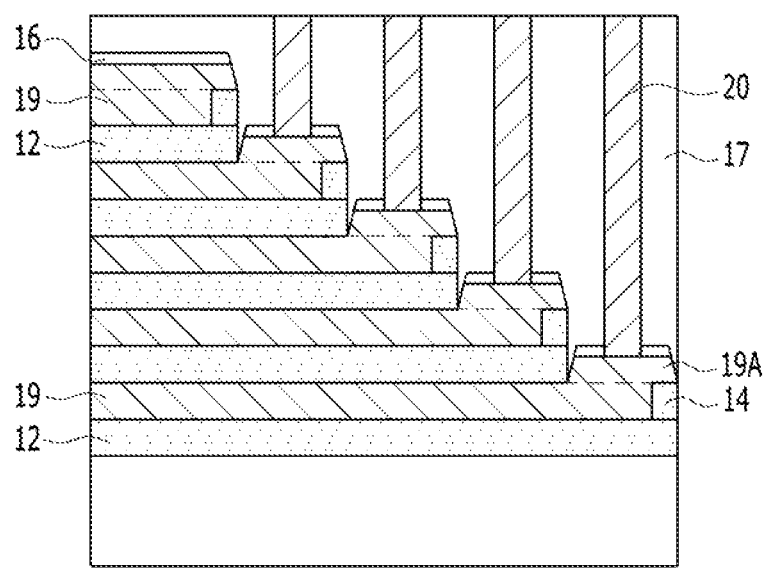

As illustrated in FIG. 3I, contact plugs 20 may be formed through the second interlayer dielectric layer 17 that contact with the respective conductive layers 19.

To form the contact plugs 20, the second interlayer dielectric layers 17 may be selectively etched to form contact holes which expose the respective conductive layers 19 in the stepped structure. Then, a conductive material may be buried in the contact holes, and an isolation process may be performed to isolate the adjacent contact plugs 20 using the second interlayer dielectric layer 17. In the present embodiment, when the contact holes are formed, the protrusion 19A of the conductive layer 19 may reduce the etching depth to secure an etching margin. Furthermore, since over-etching can be sufficiently performed by the height of the protrusion 19A, a contact open defect can be prevented while a punch is prevented.

Although not illustrated, an interconnection process for the contact plugs 20 may be subsequently performed.

In accordance with the embodiments of the present invention, the electronic device and the method for fabricating the same can secure a memory cell characteristic and an operation characteristic by preventing a bridge between memory cells.

Although various embodiments have been described for illustrative purposes, it will be apparent to those skilled in the art that various changes and modifications may be made without departing from the spirit and scope of the invention a defined in the following claims.

What is claimed is:

1. A method for fabricating an electronic device including a semiconductor memory, the method comprising:
    forming a stepped structure in which first interlayer dielectric layers and first material layers are alternately stacked over a substrate, each of the first material layers including a barrier layer formed on a sidewall of each of the first material layers over each of the first interlayer dielectric layers, wherein ends of the first material layers and the barrier layers are exposed along a profile of the stepped structure;

forming a second material layer over the ends of the first material layers and the barrier layers in the stepped structure;

forming a second interlayer dielectric layer over the stepped structure;

forming a groove by removing the first and second material layers; and burying a conductive layer in the groove.

2. The method of claim 1, wherein the first material layer comprises a nitride material.

3. The method of claim 1, wherein the first and second material layers comprise a nitride material, and the first and second interlayer dielectric layer comprise an oxide material.

4. The method of claim 1, wherein the forming of the stepped structure comprises:

forming a structure including the first interlayer dielectric layers and the first material layers which are alternately stacked over the substrate, wherein the first interlayer dielectric layers include a lowermost layer and an uppermost layer of the structure;

etching the structure such that the ends of the first interlayer dielectric layers are exposed along the profile of the stepped structure;

forming the barrier layers, each formed on the sidewall of each of the first material layers; and etching the exposed ends of the first interlayer dielectric layers.

5. The method of claim 1, wherein the barrier layers comprise an oxide material.

6. The method of claim 1, wherein the barrier layers is formed through an oxidation process.

7. The method of claim 1, wherein the barrier layers is formed through a radical oxidation process.

8. The method of claim 1, wherein the forming of the second material layer comprises:

forming the second material layer along the profile of the stepped structure;

forming a third material layer over the second material layer such that the third material layer has a thickness on a vertical surface of the stepped structure smaller than a thickness on a horizontal surface of the stepped structure;

removing the third material layer formed on the vertical surface of the stepped structure; and removing the second material layer formed on the vertical surface of the stepped structure.

9. The method of claim 8, wherein the third material layer comprises an oxide material.

10. The method of claim 8, wherein the removing of the third material layer is performed through a wet etching process.

11. The method of claim 8, wherein the removing of the second material layer is performed through a wet etching process using phosphoric acid.

12. The method of claim 1, wherein the forming of the groove is performed through a wet etching process using phosphoric acid.

13. The method of claim 1, further comprising:

forming a plurality of contact plugs connected to the respective conductive layers through the second interlayer dielectric layer, after burying the conductive layer.

14. The method of claim 1, wherein the second material layer is formed to have sidewalls having a slope and a top surface and wherein the sidewalls of the second material layer are exposed along the profile of the stepped structure.

* * * * *